(12) United States Patent
Chang et al.

(10) Patent No.: US 8,784,994 B2
(45) Date of Patent: Jul. 22, 2014

(54) PROCESS FOR SURFACE TREATING MAGNESIUM ALLOY AND ARTICLE MADE WITH SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Dun Mao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 121 days.

(21) Appl. No.: 13/188,575

(22) Filed: Jul. 22, 2011

(65) Prior Publication Data
US 2012/0171502 A1  Jul. 5, 2012

(30) Foreign Application Priority Data
Dec. 30, 2010  (CN) .......................................... 2010

(51) Int. Cl.
| | |
|---|---|
| *B05D 1/36* | (2006.01) |
| *C23C 14/34* | (2006.01) |
| *C23C 14/35* | (2006.01) |
| *B05D 3/10* | (2006.01) |
| *B32B 15/04* | (2006.01) |

(52) U.S. Cl.
USPC ................. 428/469; 204/192.12; 204/192.38

(58) Field of Classification Search
None
See application file for complete search history.

(56) References Cited

U.S. PATENT DOCUMENTS

| | | | |
|---|---|---|---|
| 5,496,597 A * | 3/1996 | Soininen et al. ............... | 427/584 |
| 6,403,209 B1 * | 6/2002 | Barton et al. ............... | 428/307.7 |
| 2012/0171500 A1 * | 7/2012 | Chang et al. ................... | 428/457 |

FOREIGN PATENT DOCUMENTS

EP  0832993 A1 *  1/1998

OTHER PUBLICATIONS

Agouram et al. Surface and Coatings Technology, 180-181, 2004, 164-168.*
Rudd et al. Corrosion Science, 42, 2000, 275-288.*
Lingjie et al. Journal of Rare Earth, 26, 3, 2008, p. 383.*
Zhang et al. Electrochimica Acta, 2010, 55, 870-877.*
Dabala et al. Surface and Coatings Technology, 172, 2003, 227-232.*

* cited by examiner

*Primary Examiner* — Vera Katz
(74) *Attorney, Agent, or Firm* — Novak Druce Connolly Bove + Quigg LLP

(57) ABSTRACT

A process for treating the surface of magnesium alloy comprises providing a substrate made of magnesium alloy. The substrate is then treated with a chemical conversion treatment solution containing cerium nitrate and potassium permanganate as main film forming agents, to form a cerium conversion film on the substrate. A ceramic coating comprising refractory metal compound is next formed on the cerium conversion film by physical vapor deposition.

4 Claims, 3 Drawing Sheets

PROCESS FOR SURFACE TREATING MAGNESIUM ALLOY AND ARTICLE MADE WITH SAME

CROSS-REFERENCE TO RELATED APPLICATIONS

The disclosures of the listed applications are incorporated by reference in this instant application. The listed applications have the same assignee as the instant application.

| Serial number | Title | Inventors | Current Status |
|---|---|---|---|
| 13/188,556 | PROCESS FOR SURFACE TREATING MAGNESIUM ALLOY AND ARTICLE MADE WITH SAME | Chang et al | Pending |
| 13/188,561 | PROCESS FOR SURFACE TREATING MAGNESIUM ALLOY AND ARTICLE MADE WITH SAME | Chang et al | Pending |
| 13/188,566 | PROCESS FOR SURFACE TREATING MAGNESIUM ALLOY AND ARTICLE MADE WITH SAME | Chang et al | Pending |

BACKGROUND

1. Technical Field

The disclosure generally relates to a process for surface treating magnesium alloy, and articles made of magnesium alloy treated by the process.

2. Description of Related Art

Magnesium alloys are widely used in manufacturing components (such as housings) of electronic devices and cars because of their properties such as light weight and quick heat dissipation. However, magnesium alloys have a relatively low erosion resistance and abrasion resistance. One method for enhancing the erosion resistance of magnesium alloy is to form ceramic coatings on its surface. However, a lot of cast magnesium alloy has many pinholes on its surface. The ceramic coatings over these pinholes are usually thinner and weaker than other portions having no pinhole, rendering pitting corrosion more likely at these locations.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary process for the surface treating of magnesium alloy and articles made of magnesium alloy treated by the process. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 2:
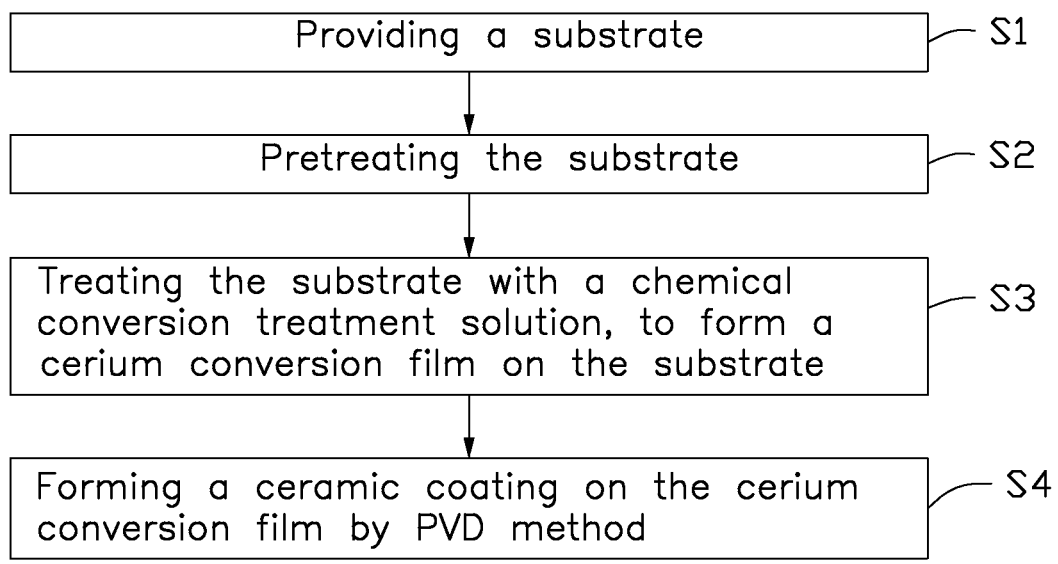
FIG. 2 is a block diagram of a process for the surface treating of magnesium alloy according to an exemplary embodiment.

Referring to FIG. 2, an exemplary process for the surface treatment of magnesium alloy may include steps S1 to S4.

Figure 1:
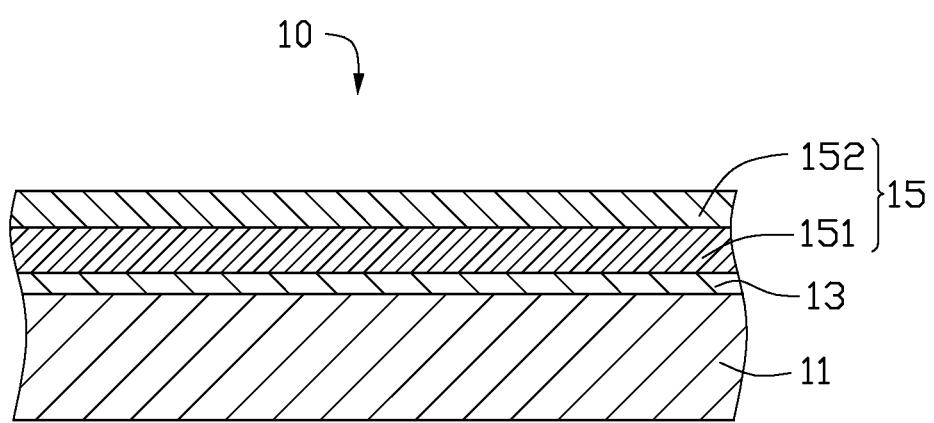
FIG. 1 is a cross-sectional view of an exemplary article treated in accordance with the present process.

In step S1, referring to FIG. 1, a substrate 11 is provided. The substrate 11 is made of a magnesium alloy, such as Mg—Al alloy, or Mg—Al—Zn alloy.

In step S2, the substrate 11 is pretreated. The pretreatment may include the following steps.

Firstly, the substrate 11 is chemically degreased with an aqueous solution, to remove impurities such as grease or dirt from the substrate 11. The aqueous solution may contain about 25 g/L-30 g/L sodium carbonate ($Na_2CO_3$), about 20 g/L-25 g/L trisodium phosphate dodecahydrate ($Na_3PO_4.12H_2O$), and an emulsifier. The emulsifier may be a trade name emulsifier OP-10 (a condensation product of alkylphenol and ethylene oxide) at a concentration of about 1 g/L-3 g/L. The substrate 11 is immersed in the aqueous solution at a temperature of about 60° C.-80° C. for about 30 s-60 s. Then, the substrate 11 is rinsed for about 20 s-60 s.

Then, the degreased substrate 11 is etched in an alkaline etchant, to create a smooth surface and further remove any impurities thereon. The alkaline etchant is an aqueous solution containing about 40 g/L-70 g/L sodium hydroxide (NaOH), about 10 g/L-20 g/L $Na_3PO_4.12H_2O$, about 25 g/L-30 g/L $Na_2CO_3$, and about 40 g/L-50 g/L sodium fluoride (NaF). The substrate 11 is immersed in the alkaline etchant maintained at a temperature of about 40° C.-50° C. for about 3 s-5 s. During this process, burrs and other small sized protrusions are dissolved.

In step S3, when the pretreatment is finished, the substrate 11 undergoes a chemical conversion treatment, to form a cerium conversion film 13. The chemical conversion treatment applies a chemical conversion treatment solution containing cerium nitrate ($Ce(NO_3)_3$) and potassium permanganate ($KMnO_4$) as main film forming agents. The chemical conversion treatment solution is an aqueous solution containing about 5 g/L-20 g/L $Ce(NO_3)_3$, and about 2 g/L-10 g/L $KMnO_4$. The pH value of the chemical conversion treatment solution may be in a range between about 1 and 5. The chemical conversion treatment may be carried out by immersing the substrate 11 in the chemical conversion treatment solution, which is maintained at about 20° C.-50° C., for about 15 min to 50 min. In an exemplary embodiment, the chemical conversion treatment solution is an aqueous solution containing about 11 g/L $Ce(NO_3)_3$, and about 4 g/L $KMnO_4$. The pH value of the chemical conversion treatment solution is about 2. The substrate 11 is immersed in the chemical conversion treatment solution maintained at about 35° C. for about 20 min. During the immersion, the chemical conversion treatment solution may be stirred. By this process, anions in the chemical conversion treatment agent react with metal atoms on a surface layer of the substrate 11, thus a cerium conversion film 13 mainly comprising hydroxide and oxide of trivalent cerium, tetravalent cerium, and divalent manganese is formed on the substrate 11.

In step S4, a ceramic coating 15 is formed on the cerium conversion film 13 by physical vapor deposition, such as magnetron sputtering or arc ion plating. The ceramic coating 15 may be single layer or multilayer refractory metal compound. The refractory metal compound can be selected from one or more of the group consisting of nitride of titanium, aluminum, chromium, zirconium, or cobalt; carbonitride of titanium, aluminum, chromium, zirconium, or cobalt; and oxynitride of titanium, aluminum, chromium, zirconium, or cobalt. In this exemplary embodiment, the ceramic coating 15 includes a first layer 151 coated on the cerium conversion film 13 and a second layer 152 on the first layer 151. The first layer 151 is an aluminum-oxygen compound layer. The second layer 152 is a chromium-oxygen-nitrogen compound layer. An exemplary process for forming the ceramic coating 15 may be performed by the following steps.

Figure 3:
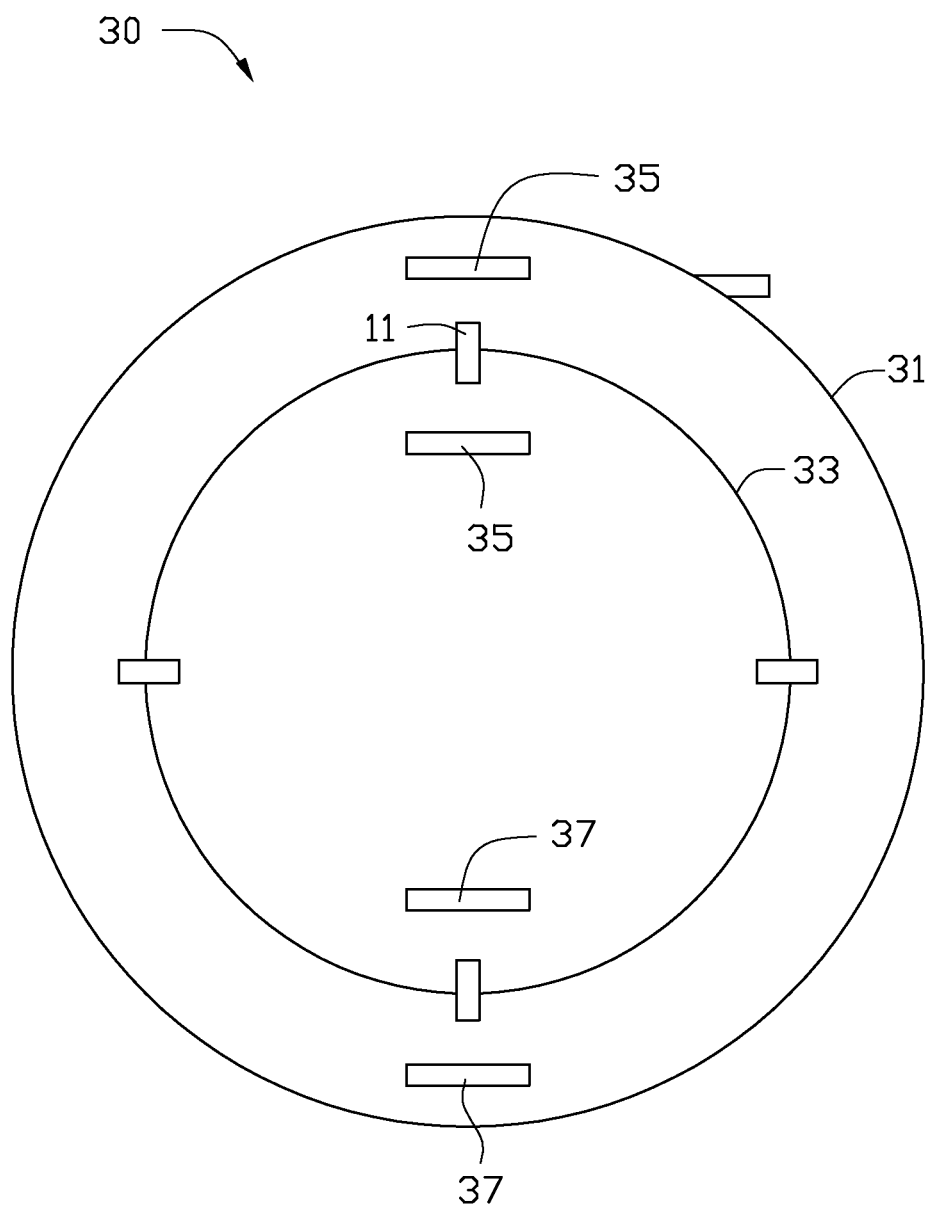
FIG. 3 is a schematic view of a vacuum sputtering machine for processing the exemplary article shown in FIG. 1.

The first layer 151 is directly formed on the cerium conversion film 13 by vacuum sputtering. The substrate 11 is held on a rotating bracket 33 in a chamber 31 of a vacuum sputtering machine 30 as shown in FIG. 3. The chamber 31 is evacuated to maintain an internal pressure of about $6\times10^{-3}$ Pa to $8\times10^{-3}$ Pa and the inside of the chamber 31 is heated to a temperature of about 100° C. to about 150° C. The speed of the rotating bracket 33 is about 0.5 revolutions per minute (rpm) to about 1.0 rpm. Argon and oxygen are simultaneously fed into the chamber 31, with the argon acting as a sputtering gas, and the oxygen acting as a reactive gas. The flow rate of argon is about 150 standard-state cubic centimeters per minute (sccm) to about 300 sccm. The flow rate of oxygen is about 50 sccm to 90 sccm. A bias voltage of about −100 volts (V) to about −300 V is applied to the substrate 11. About 8 kW to about 10 kW of electric power is applied to aluminum targets 35 fixed in the chamber 31, depositing the first layer 151 on the cerium conversion film 13. Depositing the first layer 151 may take about 30 min to about 60 min. The power may be medium-frequency AC power.

Subsequently, the second layer 152 is directly formed on the first layer 151 also by vacuum sputtering. This step may be carried out in the vacuum sputtering machine 30. The aluminum targets 35 are switched off. Argon, oxygen, and nitrogen are simultaneously fed into the chamber 31. The flow rate of oxygen is adjusted to about 40 sccm to about 100 sccm, and the flow rate of nitrogen is about 30 sccm to about 60 sccm. About 8 kW to about 10 kW of electric power is applied to chromium targets 37 fixed in the chamber 31, depositing the second layer 152 on the first layer 151. Depositing the second layer 152 may take about 30 min to about 120 min. Other parameters are the same as during deposition of the first layer 151.

The cerium conversion film 13 has a good chemical stability and high compact density, with a good erosion resistance. In addition, the cerium conversion film 13 provides a smooth surface on the substrate 11, and by such means the ceramic coating 15 formed on the cerium conversion film 13 has a substantially even thickness, reducing the susceptibility to pit corrosion. Composed of refractory metal compounds and having a high abrasion resistance, the ceramic coating 13 protects the cerium conversion film 12 from mechanical abrasion.

FIG. 1 shows a cross-section of an exemplary article 10 made of magnesium alloy and processed by the surface treatment process as described above. The article 10 may be a housing for an electronic device, such as a mobile phone. The article 10 includes the substrate 11 made of magnesium alloy, the cerium conversion film 13 formed on the substrate 11, and the ceramic coating 15 formed on the cerium conversion film 13.

The cerium conversion film 13 is formed by a chemical conversion treatment using a chemical conversion treatment solution containing $Ce(NO_3)_3$ and $KMnO_4$ as main film forming agents, as described above. The ceramic coating 15 may be a single layer or multilayer refractory metal compound. The refractory metal compound can be selected from one or more of the group consisting of nitride of titanium, aluminum, chromium, zirconium, or cobalt; carbonitride of titanium, aluminum, chromium, zirconium, or cobalt; and oxynitride of titanium, aluminum, chromium, zirconium, or cobalt. In this exemplary embodiment, the ceramic coating 15 orderly includes a first layer 151 coated on the cerium conversion film 13, and a second layer 152 on the first layer 151. The first layer 151 is an aluminum-oxygen compound layer. The second layer 152 is a chromium-oxygen-nitrogen compound layer.

A neutral salt spray test was applied to the samples created by the present process. The test conditions included 5% NaCl (similar to salt-fog chloride levels), and the test was an accelerated corrosion test for assessing coating performance. Erosion began to be observed after about 72 hours, indicating that the samples resulting from the present process have a good erosion resistance.

It is to be understood, however, that even through numerous characteristics and advantages of the exemplary disclosure have been set forth in the foregoing description, together with details of the system and functions of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
    a substrate made of magnesium alloy;
    a cerium conversion film directly formed on and in contact with the substrate, the cerium conversion film being formed by chemical conversion treatment with a chemical conversion treatment solution containing cerium nitrate and potassium permanganate as main film forming agents, the cerium conversion film comprising hydroxide of trivalent cerium, hydroxide of tetravalent cerium, hydroxide of divalent manganese, oxide of trivalent cerium, oxide of tetravalent cerium, and oxide of divalent manganese; and
    a ceramic coating comprising refractory metal compound directly formed on and in contact with the cerium conversion film by physical vapor deposition.

2. The article as claimed in claim 1, wherein the cerium conversion film is formed by immersing the substrate in the chemical conversion treatment solution maintained at about 25° C.-50° C., for about 15 min to 50 min; the chemical conversion treatment solution is an aqueous solution containing about 5 g/L-20 g/L $Ce(NO_3)_3$, and about 2 g/L-10 g/L $KMnO_4$; the pH value of the chemical conversion treatment solution is in a range between about 1 and 5.

3. The article as claimed in claim 1, wherein the refractory metal compound is selected from one or more of the group consisting of nitride of titanium, aluminum, chromium, zirconium, or cobalt; carbonitride of titanium, aluminum, chromium, zirconium, or cobalt; and oxynitride of titanium, aluminum, chromium, zirconium, or cobalt.

4. The article as claimed in claim 3, wherein the ceramic coating orderly includes a first layer coated on the cerium conversion film and a second layer on the first layer, wherein the first layer is an aluminum-oxygen compound layer, the second layer is a oxynitride chromium layer.

* * * * *